US007268005B2

(12) United States Patent
Chen et al.

(10) Patent No.: US 7,268,005 B2
(45) Date of Patent: Sep. 11, 2007

(54) APPARATUS AND METHOD FOR STACKING LASER BARS FOR UNIFORM FACET COATING

(75) Inventors: John Chen, Rowland Hieghts, CA (US); Chun Lei, Los Gatos, CA (US); Robert Shih, Arcadia, CA (US)

(73) Assignee: Finisar Corporation, Sunnyvale, CA (US)

( * ) Notice: Subject to any disclaimer, the term of this patent is extended or adjusted under 35 U.S.C. 154(b) by 639 days.

(21) Appl. No.: 10/695,641

(22) Filed: Oct. 27, 2003

(65) Prior Publication Data

US 2005/0101039 A1  May 12, 2005

Related U.S. Application Data

(60) Provisional application No. 60/422,794, filed on Oct. 30, 2002.

(51) Int. Cl.
*H01L 21/00*  (2006.01)
*H01S 3/04*  (2006.01)
*H01S 3/091*  (2006.01)
*H01S 3/094*  (2006.01)
*H01S 3/08*  (2006.01)

(52) U.S. Cl. ............... 438/21; 438/28; 438/32; 438/34; 372/108; 372/36; 372/75; 257/E21.359; 257/E21.368

(58) Field of Classification Search ............... 438/21, 438/379, 22, 28, 35, 31, 32, 34; 372/36, 372/34, 75, 50, 108, 44; 257/E21.359, E21.368
See application file for complete search history.

(56) References Cited

U.S. PATENT DOCUMENTS

| 5,170,405 A * | 12/1992 | Connolly et al. ...... 372/46.012 |
| 5,355,382 A * | 10/1994 | Kovacs et al. ............... 372/36 |
| 5,521,931 A * | 5/1996 | Biegelsen et al. ........... 372/36 |
| 6,352,873 B1 * | 3/2002 | Hoden ......................... 438/28 |
| 6,809,007 B2 * | 10/2004 | Valenti ....................... 438/455 |
| 7,063,993 B1 * | 6/2006 | Silverbrook ................. 438/21 |
| 2005/0101039 A1 * | 5/2005 | Chen et al. .................. 438/21 |

* cited by examiner

*Primary Examiner*—Walter Lindsay, Jr.
(74) *Attorney, Agent, or Firm*—Workman Nydegger (57) ABSTRACT

An apparatus for stacking photonic devices is disclosed. The apparatus can include a base, first and second spaced apart rail portions disposed on the base, and a vacuum guide disposed on the base between the rail portions for forming a vacuum gradient that pulls a plurality of photonic devices and spacer bars together into a stack. Optionally, spaced apart photonic device supports can be placed on the base between the rail portions to lift the photonic devices off of the surface of the base. The apparatus can also include a clamping system to hold the stack in place so that a vapor deposition process can be used to apply coatings to the photonic devices. In one exemplary embodiment, the photonic devices can be laser bars.

10 Claims, 7 Drawing Sheets

APPARATUS AND METHOD FOR STACKING LASER BARS FOR UNIFORM FACET COATING

CROSS-REFERENCE TO RELATED APPLICATIONS

This application claims priority to and the benefit of U.S. Provisional Patent Application No. 60/422,794, filed on Oct. 30, 2002, and entitled "Apparatus and Method for Stacking Laser Bars for Uniform Facet Coating", which is incorporated herein by reference in its entirety.

BACKGROUND OF THE INVENTION

1. The Field of the Invention

The present invention relates generally to manners of manufacturing photonic devices. More generally, the present invention relates to methods for facet coating laser diodes or other photonic devices.

2. The Relevant Technology

Figure 1A:
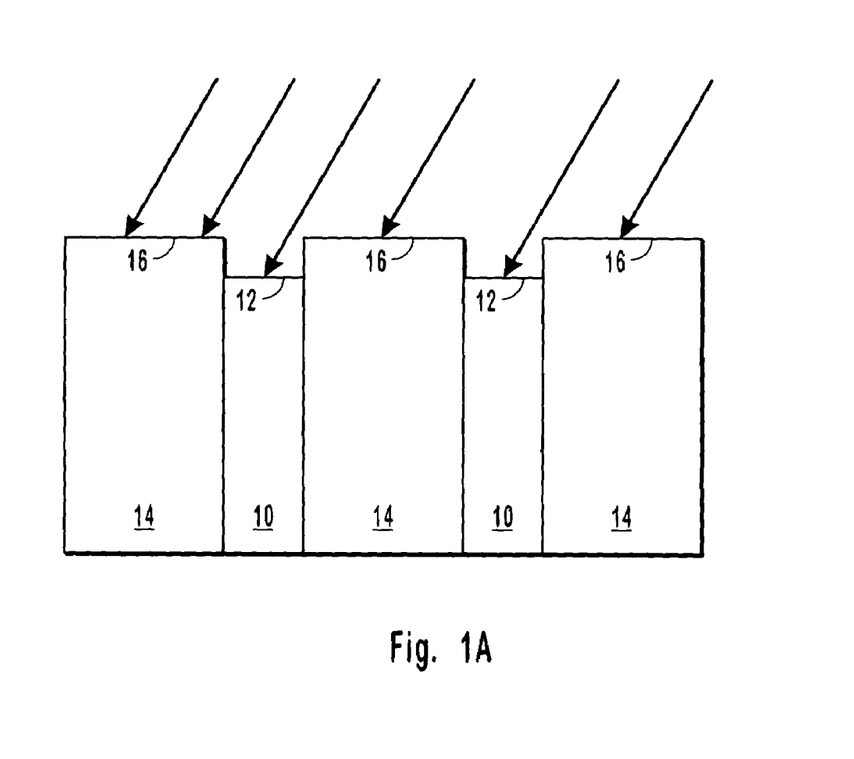
FIG. 1A illustrates an exemplary laser bar stack.
Figure 1B:
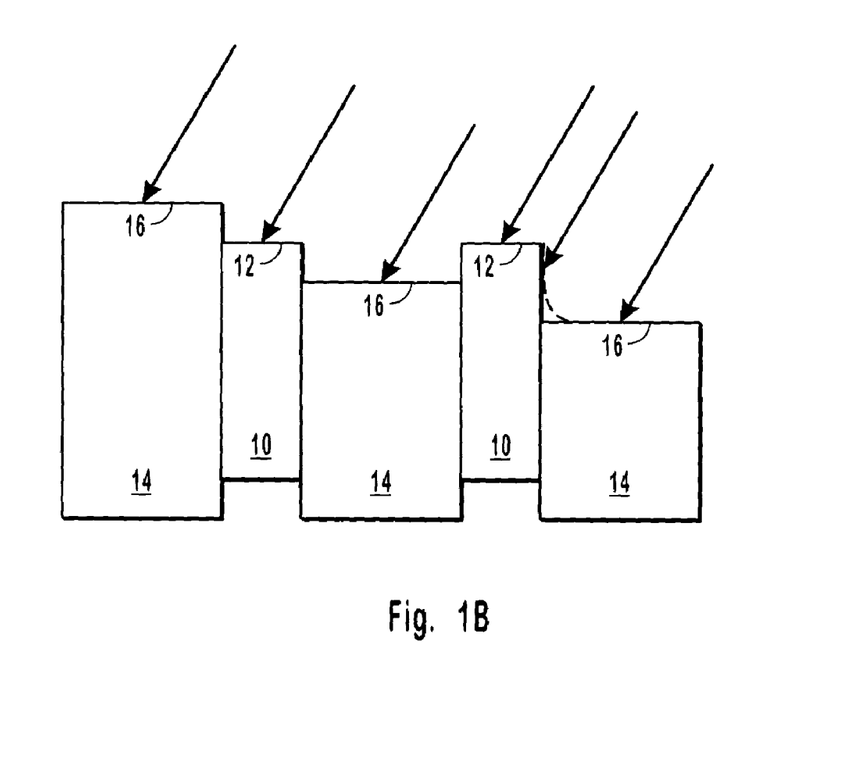
FIG. 1B illustrates another exemplary laser bar stack.

Edge-emitting lasers commonly have cleaved edges coated with an anti-reflective (AR) or highly-reflective (HR) coating to control the facet reflectivity. Typically, a number of laser bars are coated at the same time in a thin film vacuum deposition system. In a manufacturing environment it is desirable to coat the facets of a large number of laser bars simultaneously. This is often accomplished by forming a "stack" of laser bars, with each laser bar separated from its neighbor by a spacer bar, as is shown in FIGS. 1A and 1B. However, unless the laser bars and intermediate spacer bars are properly stacked, the laser mirror coating is non-uniform.

With reference to FIG. 1A, depicted is a side view representation of exemplary stacks of laser bars 10, with spacer bars 14 interposed between adjacent laser bars 10. Each spacer bar 14 can have the desired height, length, and width to aid with coating of laser bars 10 with AR or HR coatings. During the manufacturing process, the AR or HR coating is incident upon laser bars 10 and spacer bars 14 at an angle, as represented by the arrows in FIGS. 1A and 1B. In the event that a facet 12 of laser bar 10 is lower in height than a surface 16 of spacer bar 14, spacer bar 14 may shadow laser bar 10. This shadowing prevents uniform coating of surface 12 of laser bar 10, which results in degraded operation of laser bar 10.

Similarly, if surface 12 of laser bar 10 is higher than surface 16 of spacer bar 14, the deposition process on the facet of laser bar 10 will tend to be uniform but an "overspray" will occur on the sidewalls of laser bar 10, as indicated in dotted lines in FIG. 1B. When such "overspray" is excessive, the electrical characteristics of laser bar 10 can be degraded.

BRIEF SUMMARY OF THE INVENTION

What is needed is a system and method for creating stacks of laser bars and spacer bars that eliminate the potential for overspray and irregular coating of the surfaces of the laser bars. Such a system and method are disclosed and claimed herein.

The present invention can include an apparatus for stacking photonic devices, such as laser bars, stacked with one or more spacer bars. The apparatus includes a base, first and second rail portions disposed on the base, and a vacuum guide disposed on the base between the rail portions. Spacers bars used during the coating process rest upon the rail portions, while the vacuum guide forms a vacuum gradient that pulls the photonic devices and spacer bars together into a stack. Optionally, spaced apart photonic device supports can be placed on the base between the rail portions to lift the photonic devices from the surface of the base. The apparatus can also include a clamping system to hold the stack in place so that a vapor deposition process can be used to apply coatings to the photonic devices.

The present invention can also include a method for stacking photonic devices. The method can include a step for placing a plurality of photonic devices on a base, the photonic device being disposed at a first height relative to the base. Then, placing a plurality of spacer bars on rail portions that are disposed at a second height, with one spacer bar interposed between each of the photonic devices to form a sequence of bars. A vacuum applied to a vacuum gradient draws the sequence of bars into a stack that can be clamped or otherwise maintained in the desired configuration.

The present invention provides several benefits. First, photonic device and spacer bars may be rapidly loaded. Additionally, the level of the plane of each device facet relative to that of neighboring spacer bars can be controlled, improving the facet coating process. The uniformity of mirror coatings is improved due to the controlled difference in height between spacer bars and photonic device. The present invention is also faster and less expensive than robotic techniques to place each photonic device and spacer bar in the stack. Finally, exemplary embodiments of the present invention can allow both sides of a photonic device to be coated without removing the devices from a clamping mechanism.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

The present invention generally relates to methods and apparatuses used to stack a plurality of photonic devices, such as laser bars, and spacer bars, for facet coating. The present invention limits the potential for irregular coating of the surfaces of the laser bars, while facilitating efficient stacking of the plurality of laser bars and spacer bars in a repeatable manner.

Before proceeding with a discussion of the system used to stack spacer bars and the photonic devices, such as, but not limited to, laser bars, provided is a brief description of the structure and configuration of each spacer bar and photonic device. Following such a discussion, provided is a description of exemplary systems for stacking the spacer bars and photonic devices.

Figure 2:
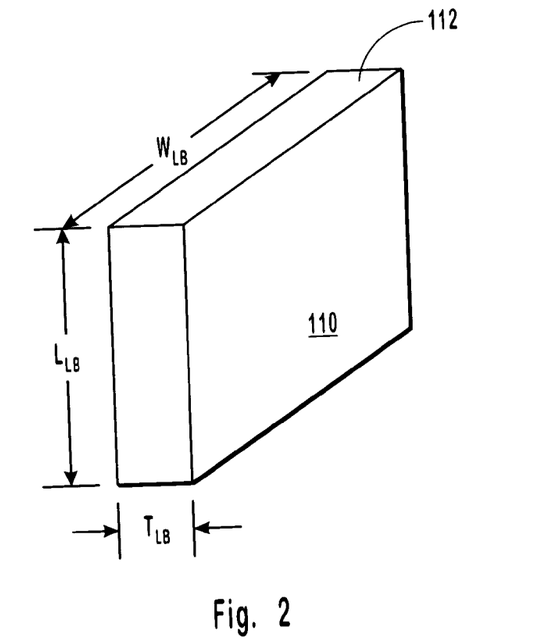
FIG. 2 illustrates an exemplary laser bar according to one exemplary configuration of the present invention.
Figure 3:
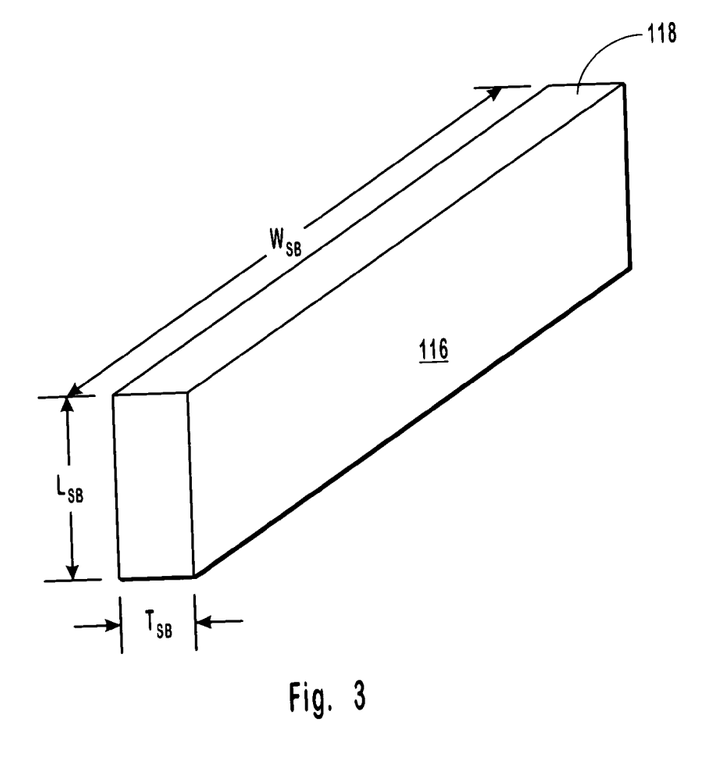
FIG. 3 illustrates an exemplary spacer bar according to one exemplary configuration of the present invention.

With reference to FIGS. 2 and 3, an exemplary photonic device 110, such as but not limited to a laser bar, and a spacer bar 116 are respectively illustrated. In FIG. 2, photonic device 110 is formed by a cleaving process. The photonic device 110 has at least one facet 112 which is to be coated with an optical coating that aids with the release of electromagnetic waves from photonic device 110. These coatings are known to those skilled in the art, and can include, but are not limited to, any coatings applied by thermal evaporation, e-beam evaporation, sputtering deposition, and ion-beam deposition. For instance, the coatings can include, but are not limited to, $SiO_2$; Si; $Si_3N_4$; $Al_2O_3$; and other coatings known to those skilled in the art.

The photonic device 110 has a cleaved length, $L_{LB}$, of less than about 500 microns. The thickness, $T_{LB}$, of laser bar 110 is typically on the order of about 100 microns, while the width, $W_{LB}$, is typically sufficient for laser bar 110 to have a substantial number of laser diodes. For example, width $W_{LB}$ can be on the order of about one centimeter depending upon the manufacturing process. Although exemplary values for $L_{LB}$, $T_{LB}$, and $W_{LB}$ are provided, one skilled in the art appreciates that various other values of $L_{LB}$, $T_{LB}$, and $W_{LB}$ are possible and desirable. For instance, a laser bar can have a length of greater or lesser than about 500 microns, a thickness of greater or lesser than about 100 microns, and a width of greater or lesser than about one centimeter.

In FIG. 3, spacer bar 116 is illustrated and has an associated width, $W_{SB}$, length, $L_{SB}$, and thickness $T_{SB}$. The spacer bar 116 has a facet 118 that is placed in close relationship to facet 112 of photonic device 110 during the manufacturing process. The spacer bar 116 can also be formed using a cleaving process. Additionally, spacer bar 116, and in some configurations photonic device 110, can be cut using a dicing saw or by some other cutting technique or method known to one skilled in the art. Various lengths, widths, and thicknesses of spacer bar 116 are possible. For instance, $W_{SB}=W_{LB}$, $W_{SB} \geq W_{LB}$, $W_{SB} \leq W_{LB}$. Similar statements can be made for $L_{LB}$, $L_{SB}$, $T_{LB}$, and $T_{SB}$.

Figure 4:
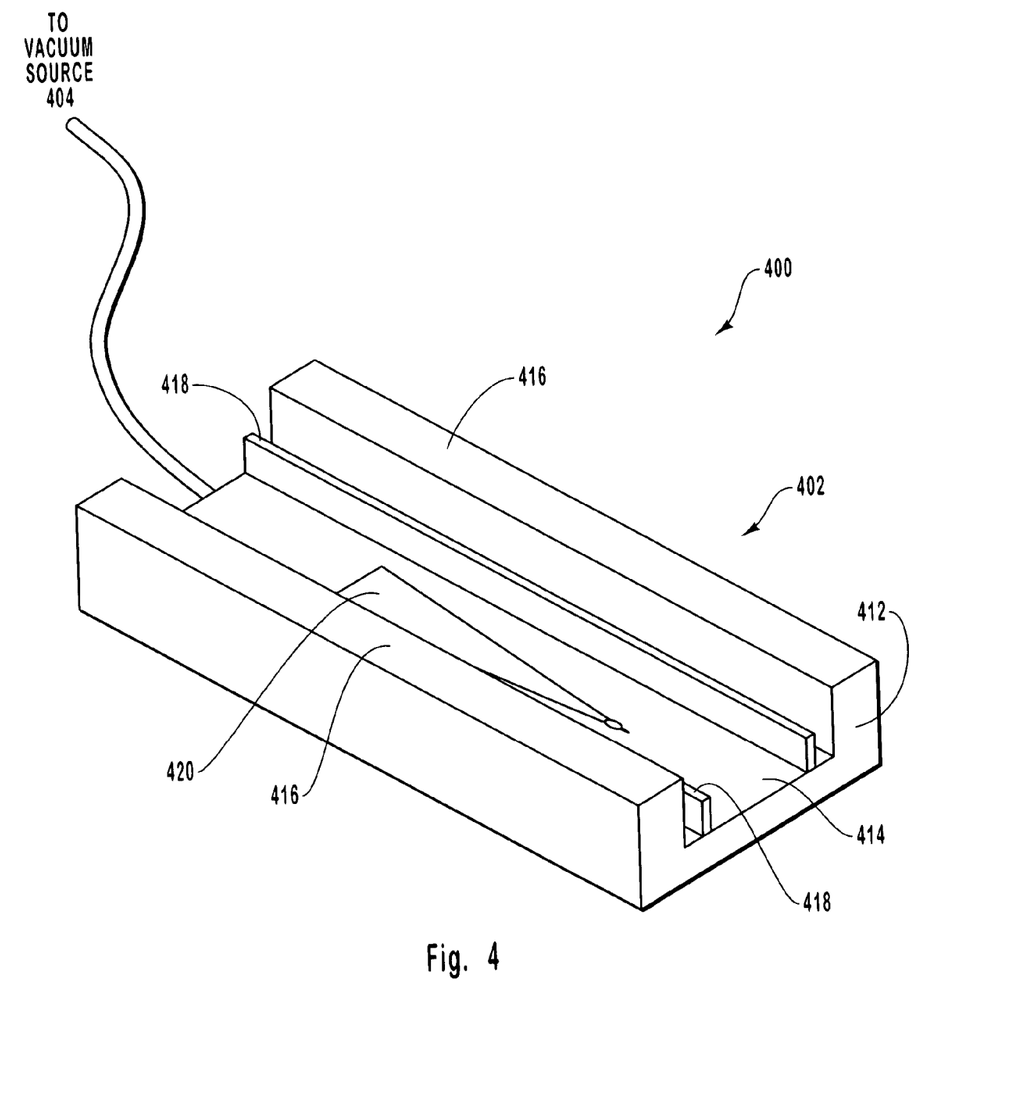
FIG. 4 illustrates a perspective view of a stacking apparatus according one exemplary configuration of the present invention.

FIG. 4 illustrates an exemplary laser stacking system, shown generally as reference numeral 400. The system 400 includes a stacking apparatus 402 that cooperates with a vacuum source 404. The combination of apparatus 402 and vacuum source 404 is used to stack photonic devices 110 and spacer bars 116 (FIGS. 2 and 3) so that photonic devices 110 are aligned one with another and spacer bars 116 are also aligned one with another. Apparatus 402 has a base 412 having a generally C-shaped or U-shaped configuration. The base 412 forms a bottom portion 414 and two raised rail portions 416 that are elevated from bottom portion 414. The height of raised rail portions 416 is selected to achieve a desired spatial separation in height between spacer bars 116 and photonic devices 110 (FIG. 4). As one example, raised rail portions 416 can be 25 to 50 microns higher than bottom portion 414. These raise rail portions 416 generally act as spacer bar support rails that support the spacer bars rested thereupon.

Extending from bottom portion 414 are photonic device supports 418. These photonic device supports 418 slightly raise the facet of photonic devices 110 above bottom portion 414, thereby preventing the majority of the laser facets from rubbing against bottom portion 414. It is understood that bottom portion 414 can include two or more photonic device supports 418 spaced to lift the ends of each photonic device 110 slightly above bottom portion 414. In an alternate exemplary embodiment, bottom portion 414 does not include photonic device supports 418, thereby allowing photonic devices 110 to contact bottom portion 414.

Disposed in bottom portion 414 is a vacuum guide 420. This vacuum guide 420 cooperates with vacuum source 404, such as a vacuum pump, through appropriate tubing, pipes, or other conduit. The vacuum source 404 draws air from around vacuum guide 420, which results in the creation of a low pressure area within bottom portion 414. This low pressure region forms near bottom portion 414 to cause photonic devices 110 and spacer bars 116 to be drawn toward bottom portion 414 and photonic device support 418.

Figure 5:
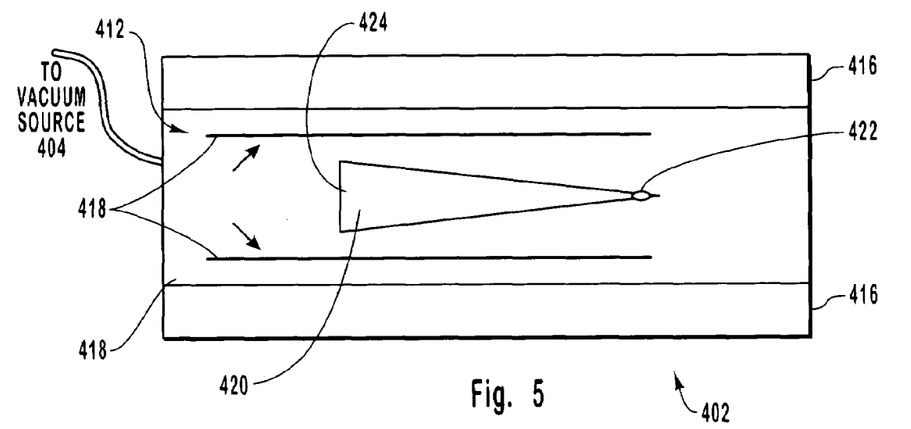
FIG. 5 illustrates a top plan view of the apparatus of FIG. 4, according to one exemplary configuration of the present invention.

To aid with moving spacer bars 116 and photonic devices 110 together, vacuum guide 420 has a tapered configuration, as best seen in FIG. 5. The vacuum guide 420 includes a first end 422 and a second end 424, the first end 422 being the tapered end of vacuum guide 420. The tapering of vacuum guide 420 creates a lower pressure region at first end or tapered end 422 than compared with the low pressure region at second end 424. This low pressure differential results in photonic devices 110 and spacer bars 116 moving toward first end or tapered end 422 and into contact one with another. The low pressure region formed near bottom portion 414 aids with moving spacer bars 116 into contact with raise rail portions 416 and photonic devices into contact with photonic device supports 418.

Figure 6A:
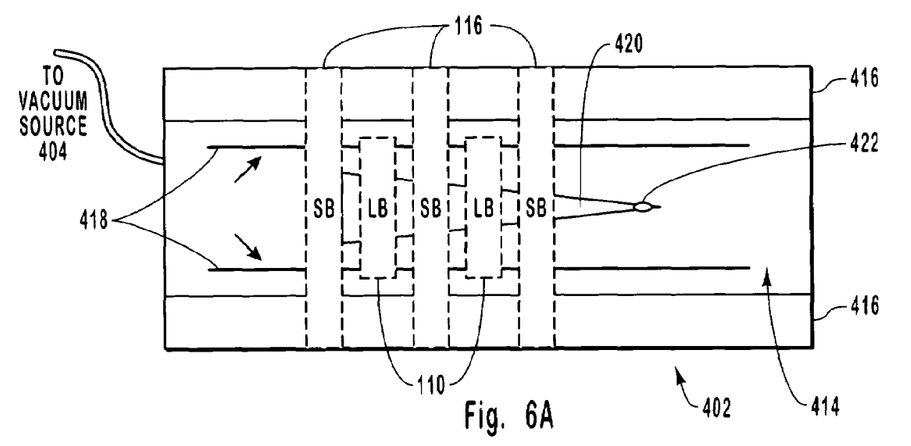
FIG. 6A illustrates an initial step of placing laser bars and spacer bars on the stacking apparatus according to one configuration of the present invention.
Figure 6B:
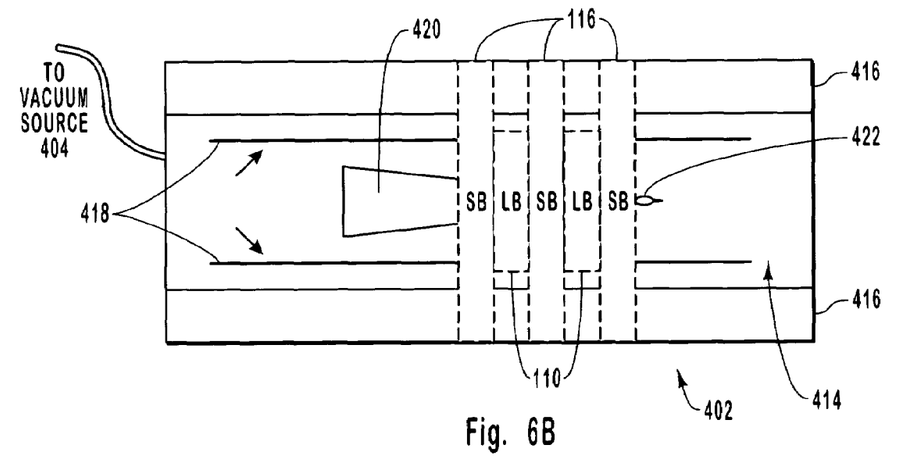
FIG. 6B illustrates how a vacuum pressure gradient forms an exemplary laser bar stack according to one configuration of the present invention.

To more clearly describe such operation, reference is now made to FIGS. 6A and 6B that illustrate the movement of photonic devices 110 and spacer bars 116. As shown in FIG. 6A, a series of photonic devices 110 and spacer bars 116 (in phantom) are placed on stacking apparatus 402. The height difference between raised rail portions 416 and bottom portion 414 permits spacer bars 116 to be offset from photonic devices 110 by a pre-selected offset distance, such as, but not limited to, about 5 microns to about 50 microns. The limit of the accuracy will depend upon machining tolerances. In some applications it can be desirable to have the capability to adjust the offset distance. One method for accomplishing this is to use any of a variety of commercially available tapes that have a highly uniform thickness.

As indicated in FIG. 6B, when vacuum source 404 operates, vacuum guide 420 draws photonic devices 110 and spacer bars 116 into proximate contact. Additionally, vacuum guide 420 pulls them towards first or tapered end 422, as shown with photonic devices 110 and spacer bars 116 in phantom. In one exemplary embodiment, vacuum guide 420 also draws photonic devices 110 down onto photonic device supports 418 and spacer bars 116 down onto the tops of rail portions 416.

Figure 7:
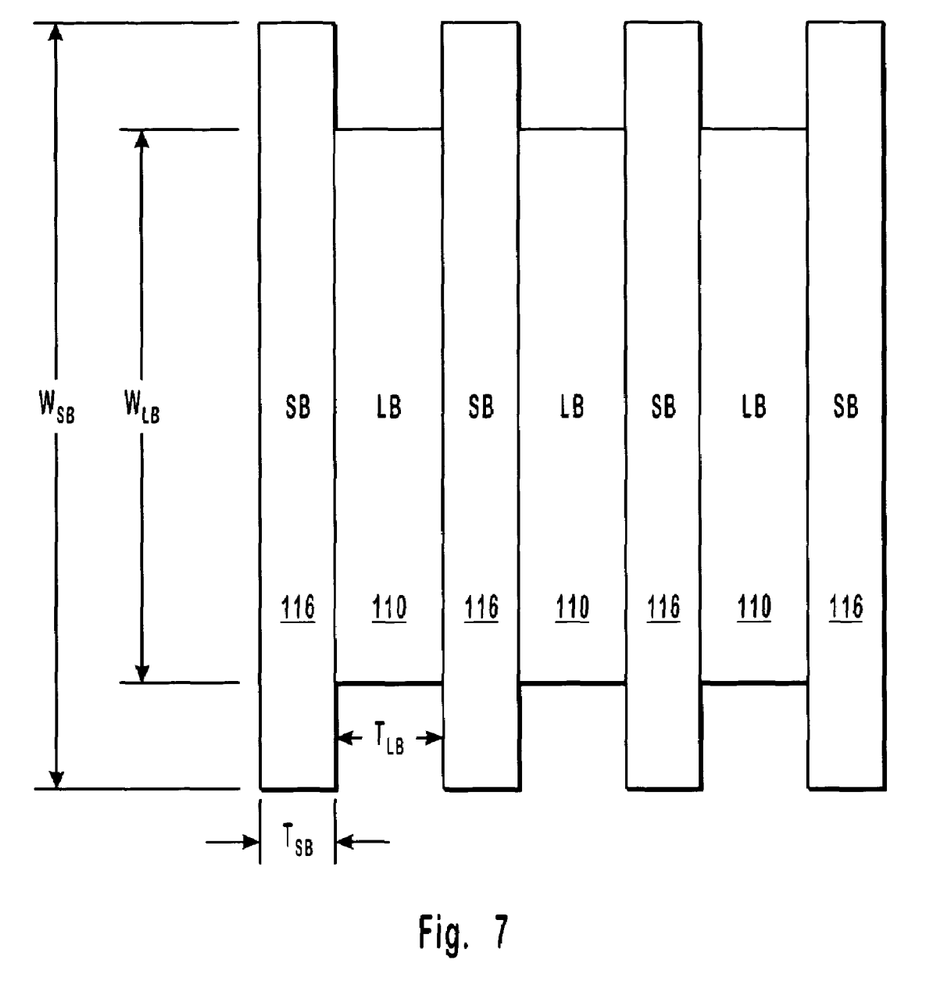
FIG. 7 illustrates an exemplary top plan view of a stack formed from one or more photonic devices and one or more spacer bars in accordance with one exemplary configuration of the present invention.

When a vacuum applied to vacuum guide 420 has drawn photonic devices 110 into place, the stack 430 illustrated in FIG. 7 is formed. As shown, $W_{LB} < W_{SB}$, although $W_{SB} \leq W_{LB}$ is also possible. To maintain the stack in the illustrated configuration, a clamp (not shown) may be placed about the end spacer bars to hold stack 430 in place. For example, a C-shaped clamp may be brought down from the top to grasp the long sides of the end spacer bars. The vacuum provided by vacuum source 404 and vacuum guide 420, shown in FIG. 6B, can then be turned off, and stack 430 removed to undergo a facet deposition process.

Figure 8:
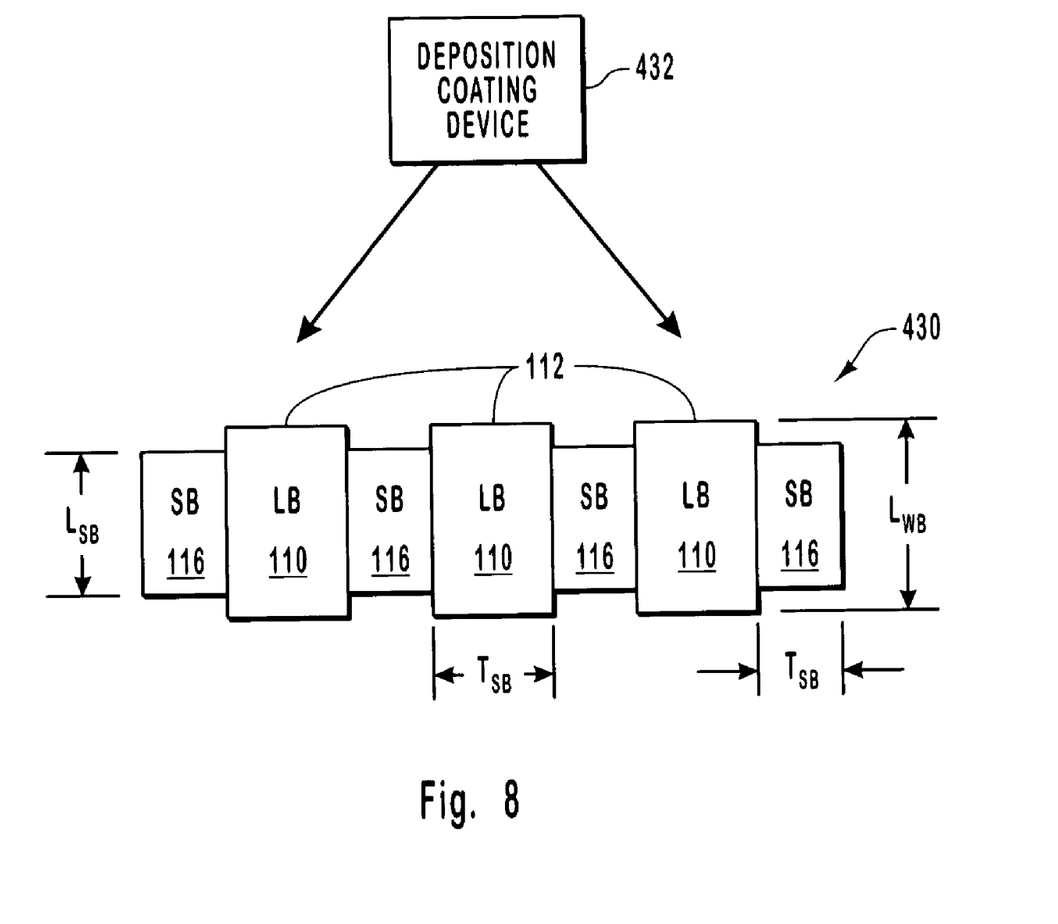
FIG. 8 illustrates a schematic representation of a deposition system cooperating with the stack of FIG. 7 according with one exemplary configuration of the present invention.

FIG. 8 shows a schematic representation of the structures used to perform the deposition process upon stack 430. As shown, stack 430 is positioned below a deposition coating device 432, such as an e-beam evaporator or some other deposition device or system, so that facets 112 of photonic devices 110 are presented before deposition coating device 432. In the illustrated configuration, each photonic device 110 and spacer bar 116 are positioned relative to one another so that each photonic device 110 is slightly oversprayed during coating of facets 112. More specifically, spacer bars 116 are slightly recessed to prevent spacer bars 116 from shadowing photonic device laser facets 112 during the vacuum deposition process. In this exemplary embodiment, spacer bars 116 can be recessed by anywhere from about 5 microns to about 25 microns. One skilled in the art will realize that in other embodiments, other spacing is possible by simply changing the position of rail portions 416 relative to photonic device supports 418. For instance, the difference in height of rail portions 416 and photonic device supports 418 can be set so that photonic devices 110 are recessed relative to spacer bars 116 or that facets 112 of photonic devices 110 are co-planar with facets 118 of spacer bars 116.

Figure 9A:
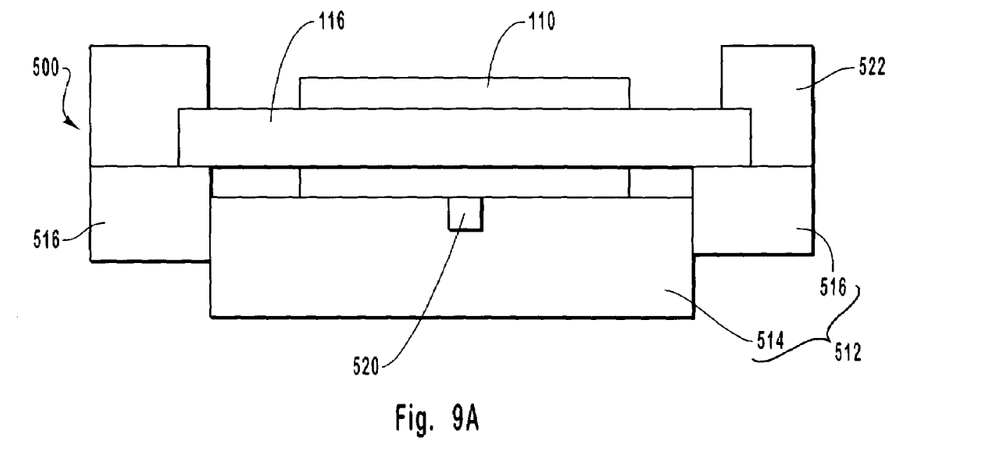
FIG. 9A is a side view illustrating another configuration of a stacking apparatus according to one exemplary configuration of the present invention.
Figure 9B:
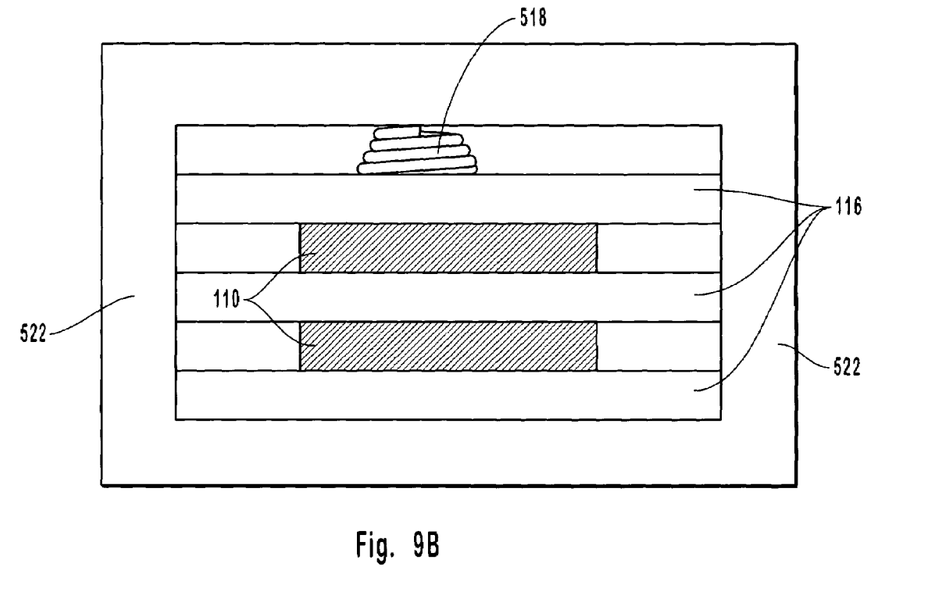
FIG. 9B is a top view of the apparatus of FIG. 9A according to one exemplary configuration of the present invention.

FIG. 9 shows an alternative exemplary embodiment of a stacking apparatus, designated generally as 500. The majority of the features of stacking apparatus 500 are similar to those discussed with respect to stacking apparatus 400. In this configuration, base 512 includes a bottom portion 514 that cooperates with removable raised rail portions 516. These rail portions 516 slip-fit to bottom portion 514 and function in a similar manner to rail portions 516, i.e., position spacer bar 116 relative to photonic device 110. Although reference is made to rail portions 516 slip-fitting with bottom portion 514, one skilled in the art will appreciate that various other manners are known by which rail portions 416 removably attach to bottom portion 514. For instance, complementary structures can be formed in rail portions 516 and bottom portion 514 that engage one with another to removably attach rail portions 416 to bottom portion 514. In another configuration, releasable adhesives or other chemical bonding techniques can be used. Mechanical fasteners or devices can also be used to removably couple or attach rail portions 516 to bottom portion 514.

As shown, bottom portion 514 includes a vacuum guide 520, which is similar to vacuum guide 420, and which aids in positioning photonic devices 110 and spacer bars 116 to form the desired stack. Once the stack is formed, a frame element 522 fits about the ends of spacer bars 116. This frame element 522 aids with aligning the ends of spacer bars 116 and retains spacer bars 116 and photonic devices 110 in relative displacement and alignment. The frame element 522, therefore acts like a clamp to maintain the stack in the desired orientation.

To also aid with orientating photonic devices 110 and spacer bars 116, apparatus 500 includes, as indicated in FIG. 9B, a biasing member 518. Locating biasing member 518 between frame element 522 and the last or first spacer bar 116 of the stack holds the stack within frame element 522. This allows frame element 522 and the mounted stack to be moved to a vacuum deposition system, such as that system described with respect to FIG. 8, as a single unit. The frame element 522 can function as the mount that supports the stack within the deposition system. In one exemplary embodiment, biasing member 518 can be a leaf spring. Alternately, biasing member 518 can be a coil spring, pneumatic structure, hydraulic structure, other mechanical structure, combinations thereof, or any other structure that urges the stack of spacer bars 116 and photonic devices 110 together.

One advantage of the exemplary embodiment of FIGS. 9A and 9B is that it permits both facets of the photonic device, such as a laser bar, to be coated without removing the photonic devices from the frame. For example, a conventional C-shaped clamping mechanism permits only one of the two facets of the photonic device to be coated without shadowing by the clamp. In contrast, the frame element of FIGS. 9A and 9B may be rotated 180 degrees to coat both facets of the photonic device.

The present invention provides several benefits. First, photonic devices and spacer bars may be rapidly loaded. Additionally, the level of the plane of each device facet relative to that of neighboring spacer bars may be controlled, improving the facet coating process. The uniformity of mirror coatings is improved due to the controlled difference in height between spacer bars and photonic devices. The present invention is also faster and less expensive than robotic techniques to place each photonic device in the stack. Finally, the present invention allows both sides of a photonic device to be coated without removing the devices from a clamping mechanism.

While the present invention has been discussed with respect to edge-emitting laser bars, more generally it may be applied to a variety of photonic devices that have a facet requiring a facet coating. Examples include passive waveguides, waveguides, and integrated optical devices. Additionally, while in one embodiment it is desirable to have the active region having a height difference selected to produce controlled overspray, it will also be understood that the present invention could also be utilized to form a height difference selected to produce intentional shadowing.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for stacking photonic devices, comprising;

a base;

first and second spaced apart support rails disposed on said base; and a vacuum guide disposed on said base between said support rails, said vacuum guide communicating with a vacuum source so that a vacuum gradient is formed in close proximity to said base.

2. The apparatus of claim 1, further comprising first and second spaced apart photonic device supports disposed between said support rails.

3. The apparatus of claim 2, wherein said photonic devices comprise laser bars.

4. The apparatus of claim 3, wherein at least one spacer bar is placed on said support rails between at least two of said laser bars.

5. The apparatus of claim 4, wherein a vacuum is applied to said vacuum guide to bring said at least one spacer bar and at least two laser bars into contact with each other.

6. The apparatus of claim 5, further comprising a clamp to hold said at least one spacer bar and said at least two laser bars in contact with each other.

7. The apparatus of claim 6, further comprising a plurality of spacer bars disposed in an alternating arrangement with said laser bars.

8. The apparatus of claim 3 wherein at least two spacer bars are placed on said support rails and at least one laser bar is placed between said at least two spacer bars.

9. The apparatus of claim 8, wherein a vacuum is applied to said vacuum guide to bring said spacer bars and said laser bar into contact with each other.

10. The apparatus of claim 9, further comprising a clamp to hold said spacer bars and said laser bar in contact with each other.

* * * * *